(12) United States Patent
Kimura et al.

(10) Patent No.: US 11,016,138 B2
(45) Date of Patent: May 25, 2021

(54) DIAGNOSIS SYSTEM FOR POWER CONVERSION DEVICE, DIAGNOSIS METHOD FOR SEMICONDUCTOR MODULE, AND POWER CONVERSION DEVICE

(71) Applicant: Hitachi, Ltd., Tokyo (JP)

(72) Inventors: Yoshinobu Kimura, Tokyo (JP); Junichi Sakano, Tokyo (JP); Kimihisa Furukawa, Tokyo (JP); Takashi Ogawa, Tokyo (JP); Renichi Yamada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 364 days.

(21) Appl. No.: 16/098,599

(22) PCT Filed: May 9, 2016

(86) PCT No.: PCT/JP2016/063737
§ 371 (c)(1),
(2) Date: Nov. 2, 2018

(87) PCT Pub. No.: WO2017/195247
PCT Pub. Date: Nov. 16, 2017

(65) Prior Publication Data
US 2019/0146026 A1    May 16, 2019

(51) Int. Cl.
*G01R 31/26* (2020.01)
*B60L 3/00* (2019.01)
(Continued)

(52) U.S. Cl.
CPC .......... *G01R 31/2619* (2013.01); *B60L 3/003* (2013.01); *G01K 7/01* (2013.01);
(Continued)

(58) Field of Classification Search
CPC ......... H03K 2017/0806; H03K 17/145; G01R 31/2642; G01R 31/2628; G01R 31/2619;
(Continued)

(56) References Cited

U.S. PATENT DOCUMENTS 8,610,406 B2 * 12/2013 Ladurner ........... H03K 17/0822
320/150
2013/0177041 A1  7/2013 Sundaramoorthy et al.
(Continued)

FOREIGN PATENT DOCUMENTS

| CA | 2 185 125 A1 | 9/1995 |
| JP | 2013-142704 A | 7/2013 |
| WO | WO 2016/042970 A1 | 3/2016 |

OTHER PUBLICATIONS

Extended European Search Report issued in counterpart European Application No. 16901596.3 dated Jan. 3, 2020 (nine (9) pages).
(Continued)

*Primary Examiner* — Huy Q Phan
*Assistant Examiner* — Dustin R Dickinson
(74) *Attorney, Agent, or Firm* — Crowell & Moring LLP (57) ABSTRACT

A diagnostic system for a power conversion apparatus including a semiconductor device and performing a switching operation for carrying and interrupting a main current to a main current is disclosed. This system includes a trigger circuit that acquires reference time for the switching operation; and a delay time calculation circuit that acquires first time at which the main current takes a first main current set value and second time at which the main current takes a second main current set value, and that detects numerical data about a difference between the first time and the reference time and numerical data about a difference between the second time and the reference time.

11 Claims, 10 Drawing Sheets

(51) Int. Cl.
*G01K 7/01* (2006.01)
*H03M 1/12* (2006.01)

(52) U.S. Cl.
CPC ......... *G01R 31/26* (2013.01); *G01R 31/2642* (2013.01); *H03M 1/12* (2013.01); *G01K 2217/00* (2013.01)

(58) Field of Classification Search
CPC ... G01R 31/26; B60L 3/003; B60L 2240/525; G01K 7/01; G01K 2217/00; H03M 1/12
See application file for complete search history.

(56) References Cited

U.S. PATENT DOCUMENTS

| | | |
|---|---|---|
| 2013/0257177 A1 | 10/2013 | Jacobson et al. |
| 2014/0217942 A1 | 8/2014 | Fukuta et al. |
| 2014/0269831 A1 | 9/2014 | Tang |
| 2015/0181334 A1* | 6/2015 | Ishii ...................... H04R 9/022 381/55 |
| 2016/0116345 A1* | 4/2016 | Furtner .................... G01K 7/01 374/178 |
| 2016/0154193 A1* | 6/2016 | Brukilacchio ..... G02B 19/0066 315/151 |
| 2016/0218621 A1* | 7/2016 | Hayashi ................ H02M 1/088 |
| 2017/0282720 A1 | 10/2017 | Sakano et al. |

OTHER PUBLICATIONS

Ginart et al., "Time Delay as a Diagnostic Technique for Power Drives", Aerospace Conference, Mar. 7, 2009, pp. 1-7, Piscataway, NJ, USA, XP031450263 (seven (7) pages).
International Search Report (PCT/ISA/210) issued in PCT Application No. PCT/JP2016/063737 dated Jul. 12, 2016 with English translation (two (2) pages).
Japanese-language Written Opinion (PCT/ISA/237) issued in PCT/JP2016/063737 dated Jul. 12, 2016 (three (3) pages).

* cited by examiner

DIAGNOSIS SYSTEM FOR POWER CONVERSION DEVICE, DIAGNOSIS METHOD FOR SEMICONDUCTOR MODULE, AND POWER CONVERSION DEVICE

TECHNICAL FIELD

The present invention relates to a power conversion apparatus and particularly relates to a technique for the maintenance or diagnosis of a power conversion apparatus which is for use in control over a railway vehicle electric motor or over a large-scale industrial electric motor, or which is configured with a power semiconductor switch device.

BACKGROUND ART

In a power conversion apparatus which is for use in control over a railway vehicle electric motor or a large-scale industrial electric motor, or which is, for example, a mass-storage frequency conversion apparatus for an electric power system, there is exercised control over high-voltage and high-current electric power with using a mass-storage power semiconductor module. If a failure occurs in such an apparatus in operation, then system damage or unintended system shutdown follows the failure, possibly resulting in the occurrence of an enormous economic loss. To prevent these situations, it is necessary to detect a deterioration or an abnormality in the power conversion apparatus, shut down functions to prevent breakage, notify those involved of the need of maintenance, and exercise life prolongation control over the power conversion apparatus.

Small-capacity semiconductor chips (transistors and diodes) are connected in parallel in the mass-storage power semiconductor module, and the semiconductor chips are designed to equivalently perform a switching operation.

Nevertheless, if a parameter for even one device in any of the semiconductor chips within the power semiconductor module exceeds a permissible variation range while the power conversion apparatus is in operation, then switching timing of the semiconductor chip differs from that of the other semiconductor chips, and an imbalance occurs such as the concentration of a flow of a current on the device or a difficulty in the flow of a current in the device. As a result, the entire semiconductor module possibly exhibits thermal runaway and is possibly, eventually destroyed.

To address the problem, there is known a method of detecting an overtemperature abnormality in a power semiconductor to which a current is carried or interrupted in the power conversion apparatus by providing a temperature sensor near the power semiconductor. However, change in a heat resistance in the power semiconductor makes it difficult to detect a temperature increase of the semiconductor chip. There is known, in turn, directly detecting an abnormality in a temperature (junction temperature) of the semiconductor chip itself. Examples of such a technique include JP-2013-142704-A (Patent Document 1). This example discloses a method of determining a junction temperature of an IGBT (insulated gate bipolar transistor) device by detecting a time delay between start and end of a Miller plateau phase of a gate-emitter voltage characteristic of the IGBT device during a switch-off phase of the IGBT device.

Furthermore, while a cooler is mounted in the power conversion apparatus, a cooling capacity of the cooler is often insufficient depending on an operating environment; thus, a temperature sensor is often provided in a cooling fin or a cooling fan for monitoring or control.

PRIOR ART DOCUMENT

Patent Document

Patent Document 1: JP-2013-142704-A

SUMMARY OF THE INVENTION

Problem to be Solved by the Invention

As described above, for the stable operation of the power conversion apparatus, it is important to monitor the semiconductor chips in the power semiconductor module that is a heating source and the cooling system.

Nevertheless, while the power conversion apparatus is in operation, the chips in the semiconductor module have individual heat distributions and have different heat histories depending on positions of the chips. As a result, a variation in long-term reliability among the chips is greater than that in initial characteristics, which requires detection of a temperature abnormality in each chip in the module. In this respect, if the technique disclosed in JP-2013-142704-A is used in the module configured with parallel chips, an average temperature of the parallel chips is eventually indicated.

Moreover, packaging temperature sensors in the individual chips causes an increase in a cost of the semiconductor module. Furthermore, the heat resistance causes a reduction in precision.

On the other hand, a reduction in the cooling capacity during operation requires maintenance such as cleaning on a regular basis, depending on the power conversion apparatus; however, there is no method of identifying whether the temperature increase of the semiconductor module itself or the cooling system causes a deteriorated performance or a malfunction of the power conversion apparatus.

An object of the present invention is to provide a method that can overcome the problems described above, highly precisely detect an abnormality or a deterioration in a power semiconductor and a power conversion apparatus associated with the power semiconductors with a simple configuration, highly precisely prevent a malfunction such as a failure, and ensure long-term use. The present invention provides a system that acquires an overall average temperature and a local temperature of one chip without machining a power semiconductor module, feeds back a measurement result to an electric motor control to take measures to prolong a life of the power module, and alert a user to the need of the replacement of components or the maintenance of a cooler.

Means for Solving the Problem

The inventors discovered that a waveform delay of a main current (collector current) during turn-off with a first set value has sensitivity for a module overall temperature and has no sensitivity therewith for a one-chip local temperature. On the other hand, the waveform delay of the main current with a second set value has sensitivity for both the module overall temperature and the one-chip local temperature. The present invention is based on the discoveries.

According to one aspect of the present invention, provided is a diagnostic system for a power conversion apparatus that includes a semiconductor device and that performs a switching operation for carrying and interrupting a main current to a main circuit. This system includes: a temperature detection section that can measure temperatures on the basis of delay time from switch command time with two preset main current set values in turning off a transistor; a control system that controls a module to perform a relaxation operation from a temperature detection result; and a user interface section that displays an abnormal module, issues an instruction to inspect a cooling system, and issues an alert to a module life.

According to a preferable embodiment of this system, in order to measure a skirt part of a tail part (skirt part) of a main current, a user can decide a first main current set value and a second main current set value, and a clip circuit for main current waveform delay in a second main current set region is provided.

In a specific example of applying this system, the temperature detection section is configured integrally with the power conversion apparatus or is separably connected thereto by wired connection, wireless connection, or terminal connection. Furthermore, the user interface section is configured integrally with the temperature detection section or separably connected to the temperature detection section by wired connection, wireless connection, or terminal connection. This example has a high degree of freedom in configuration; thus, for example, a monitoring system in a remote location can carry out a diagnosis of the power conversion apparatus mounted in an electric train or the like.

According to another aspect of the present invention, provided is a diagnostic method for a power conversion apparatus that includes a semiconductor switching device and that performs a switching operation for carrying and interrupting a main current. This method includes: a first step of detecting delay time at a first set value of the main current; a second step of detecting delay time at a second set value; and a third step of detecting an overall temperature and a local one-chip temperature of a semiconductor module on the basis of the delay time, and determining a state of the power conversion apparatus.

As a specific configuration, a delay amount for a predetermined period is obtained using a transient current of the skirt part during switch interruption.

It is possible to carry out a diagnosis of a state of the power conversion apparatus using a result of the delay amount. Furthermore, it is possible to control the power conversion apparatus on the basis of a diagnosis result. Moreover, it is possible to diagnose whether the semiconductor module or a cooling system causes an abnormality in the power conversion apparatus.

Typical examples of operating condition control include providing a limit value to a value of a maximum current when a current is carried to the switch device in the power conversion apparatus (a relaxation operation). Furthermore, as a specific example of the switch device, an insulated gate bipolar transistor or the like can be used as a power semiconductor. Moreover, as a power semiconductor module, a mass-storage semiconductor module in which small-capacity semiconductor chips are connected in parallel can be used.

According to yet another aspect of the present invention, provided is a diagnostic system for a power conversion apparatus including a semiconductor device and performing a switching operation for carrying and interrupting a main current to a main circuit. This system includes: a trigger circuit that acquires reference time for the switching operation; and a delay time calculation circuit that acquires first time at which the main current takes a first main current set value and second time at which the main current takes a second main current set value, and that detects numerical data about a difference between the first time and the reference time and numerical data about a difference between the second time and the reference time.

According to still another aspect of the present invention, provided is a diagnostic method for a semiconductor module that mounts a plurality of switching devices and that performs a switching operation for carrying and interrupting a main current on the basis of a drive command signal. This method includes: a reference time setting step of setting reference time for the switching operation during interruption of the main current; a first delay time measuring step of measuring as first delay time a delay of first time at which the main current takes a first main current set value from the reference time during the interruption of the main current; and a second delay time measuring step of measuring as second delay time a delay of second time at which the main current takes a second main current set value from the reference time during the interruption of the main current. Furthermore, the first main current set value is set larger than the second main current set value.

According to still another aspect of the present invention, provided is a power conversion apparatus to which a direct current is input and which outputs an alternating current to a load. This apparatus includes: a plurality of semiconductor modules; a control command signal generation section that instructs the plurality of semiconductor modules to perform a switching operation; and a plurality of controllers each of which corresponds to one of the plurality of semiconductor modules. Furthermore, each of the plurality of semiconductor modules includes a plurality of semiconductor switching devices connected in parallel, the control command signal generation section generates a control command signal to instruct the plurality of semiconductor switching devices to interrupt a main current, the controllers each includes a temperature detection section that determines two types of temperatures for the corresponding semiconductor module. The temperature detection section includes a trigger circuit that sets reference time from the control command signal; a first delay time measuring section that measures as first delay time a delay of first time at which the main current takes a first main current set value from the reference time during interruption of the main current; and a second delay time measuring section that measures as second delay time a delay of second time at which the main current takes a second main current set value from the reference time during the interruption of the main current, and a first temperature is determined from the first delay time, and a second temperature is determined from the second delay time.

Effect of the Invention

According to the present invention, it is possible to highly precisely detect an abnormality or a deterioration in a power semiconductor and a power conversion apparatus associated with the power semiconductor with a simple configuration, and feed back a detection result to relaxation operation or carry out maintenance or a diagnosis.

MODES FOR CARRYING OUT THE INVENTION

Embodiments of the present invention will be explained hereinafter in detail with reference to the accompanying drawings. It is noted, however, the present invention is not interpreted while being limited to contents described in the embodiments below. A person skilled in the art could easily understand that specific configurations of the present invention can be changed without departure from an idea or intent of the present invention.

In the configurations of the invention to be explained below, identical reference characters are used to denote identical parts or parts having similar functions commonly among different drawings and repetitive explanation therefor will be often omitted. In the embodiments, if a plurality of constituent elements that can be regarded as equivalent elements, indexes are often added to an identical reference character for distinction. However, if there is no need to particularly distinguish these elements, the elements will be often explained without such indexes.

In the present specification and the like, a designation such as "first," "second," and "third" is added to identify each constituent element and does not necessarily limit an equation or an order. Furthermore, a number for identifying each constituent element is employed on context by context basis and the number used in one context does not always denote an identical configuration in other contexts. Moreover, the number is not intended to inhibit a function of a constituent element identified by a certain number from being shared by other constituent elements.

A position, a magnitude, a shape, a range, and the like of each configuration depicted in the drawings and the like do not often represent an actual position, an actual magnitude, an actual shape, an actual range, and the like, for helping understand the invention. For this reason, the present invention is not always limited to the positions, the magnitudes, the shapes, the ranges, and the like disclosed in the drawings and the like.

First Embodiment

<1. Overall System Configuration>

A diagnostic system that is one embodiment of the present invention will be explained with reference to FIGS. 1, 2, and 3.

Figure 1:
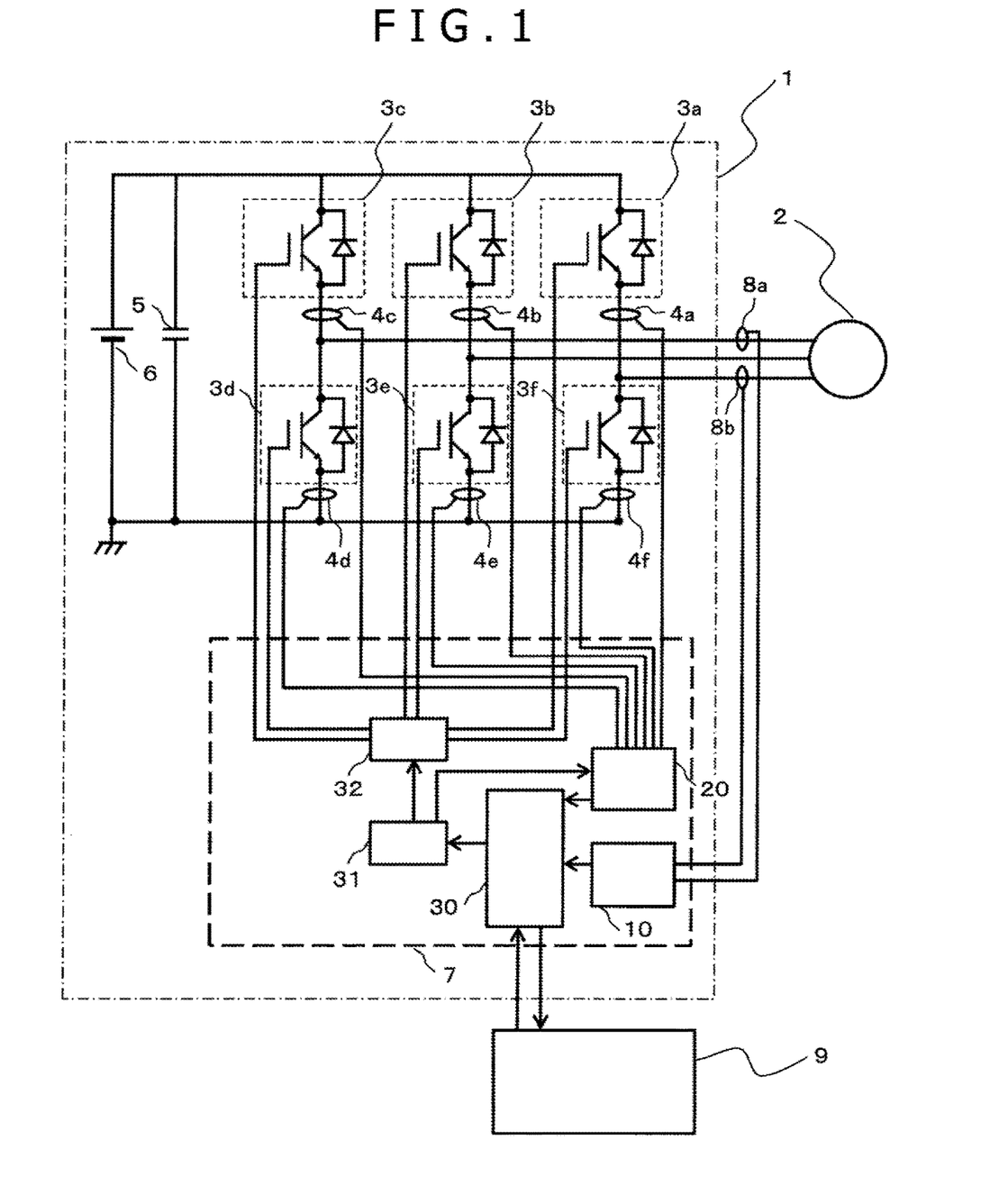
FIG. 1 is a block diagram illustrating an embodiment of a power conversion apparatus according to the present invention.

FIG. 1 is a block diagram illustrating a configuration of the diagnostic system in the embodiment. The diagnostic system is configured with a power conversion apparatus 1, a three-phase electric motor 2 driven as a load by this power conversion apparatus 1, and a graphical user interface (GUI) 9 for monitoring a state of the electric motor. The power conversion apparatus 1 includes a controller 7. Current sensors 8a and 8b each measuring a phase current to be supplied to the electric motor are provided between the power conversion apparatus 1 and the electric motor 2.

The power conversion apparatus 1 is an apparatus that converts a direct-current voltage source 6 into three-phase alternating-current voltages to control the electric motor 2. The power conversion apparatus 1 includes a smoothing capacitor 5, semiconductor modules 3a to 3f, main current sensors (for example, Rogowski coils) 4a to 4f, and the controller 7. While the main current sensors 4a to 4f are disposed outside of the semiconductor modules 3a to 3f in FIG. 1, the main current sensors 4a to 4f may be integrated into the semiconductor modules 3a to 3f.

In each of the semiconductor modules 3a to 3f, a transistor such as an IGBT (insulated gate bipolar transistor) and a diode (such as a PN diode or a Schottky barrier diode) are connected in anti-parallel.

Figure 2:
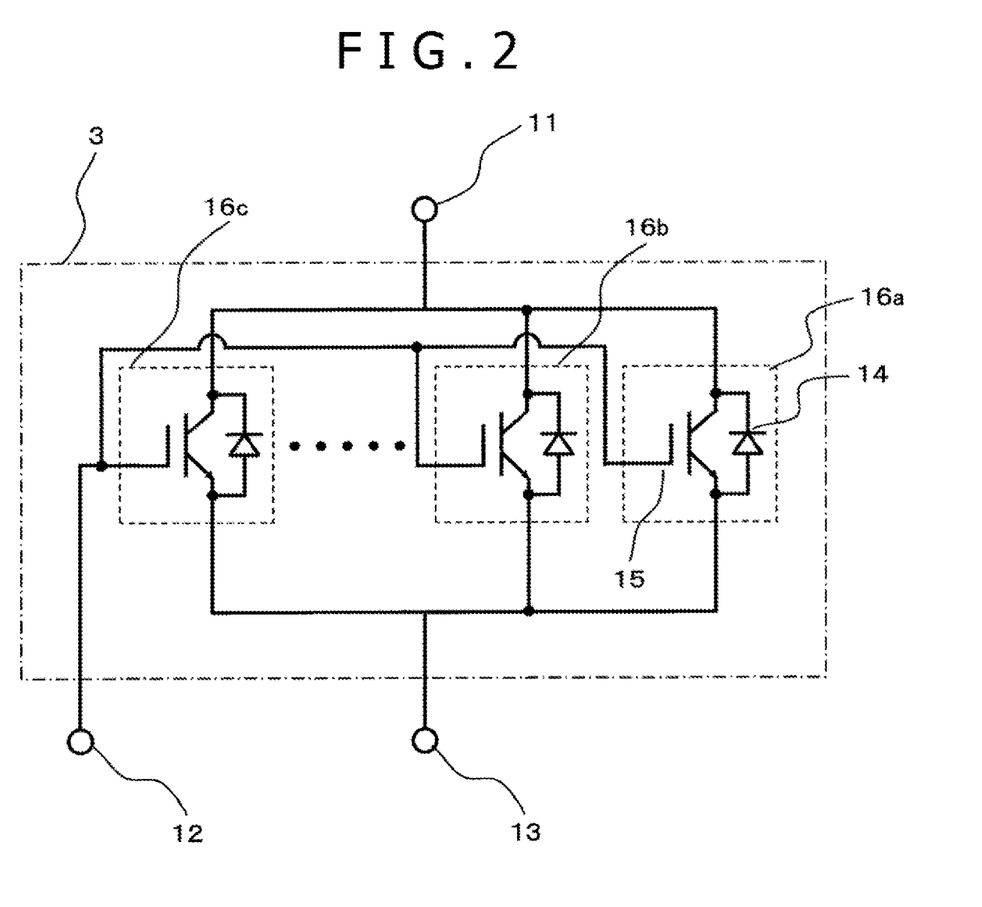
FIG. 2 is a block diagram illustrating a semiconductor module depicted in FIG. 1 and configured with parallel chips.

FIG. 2 illustrates a specific example of the semiconductor module 3. The semiconductor module 3 has a large capacity for controlling a high current and a plurality of small-capacity semiconductor chips 16a to 16c are connected in parallel. While a transistor 15 and a diode 14 are fabricated on the same semiconductor chip 16a in anti-parallel, the transistor 15 and the diode 14 may be fabricated on different semiconductor chips and connected to each other in anti-parallel. A collector terminal 11, a gate terminal 12, and an emitter terminal 13 are provided on the semiconductor module 3.

Figure 3:
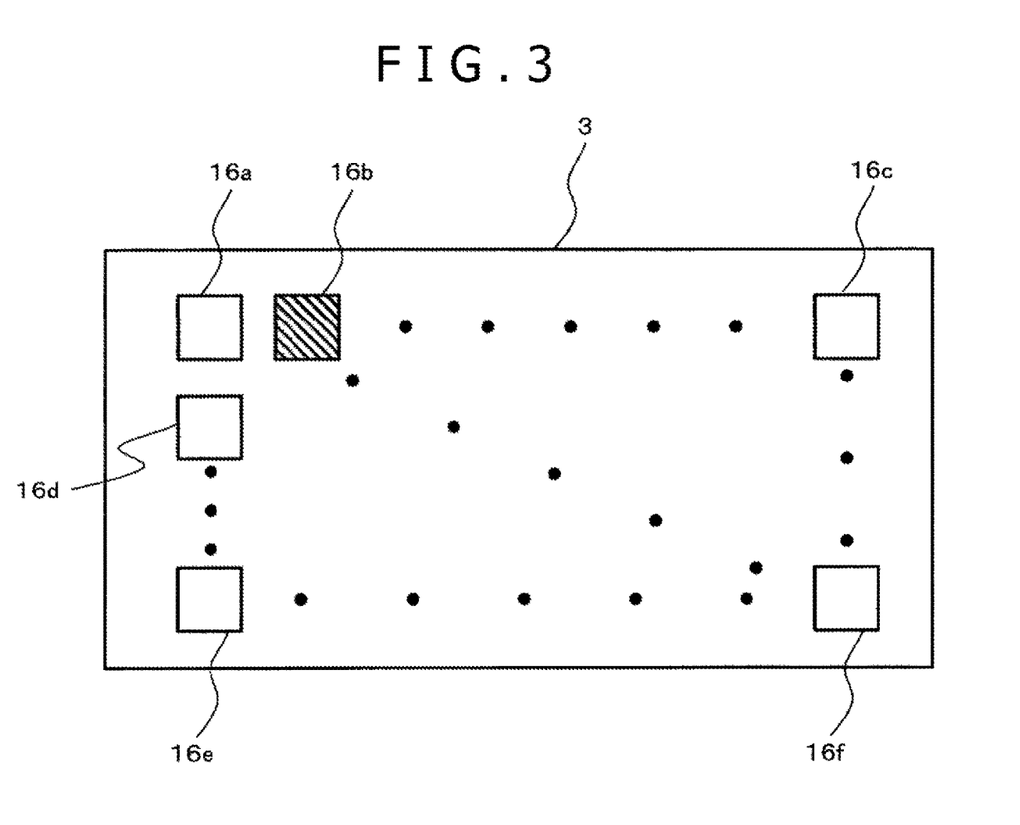
FIG. 3 is a plan view illustrating disposition of the parallel chips in the semiconductor module.

FIG. 3 illustrates a plan view of one semiconductor module 3. In the semiconductor module 3, semiconductor chips 16a to 16f are disposed on an insulating substrate and connected to one another by a metal plate and a metal wire (not depicted). Semiconductor chips each having a variation in electrical characteristics that falls within a certain range are selected as the semiconductor chips 16a to 16f and the semiconductor chips 16a to 16f are designed to achieve an electrical balance thereamong. The semiconductor chips 16a to 16f generate heat while operating; however, the semiconductor chips 16a to 16f are thermally designed such that each heat distribution falls within a rated distribution. Nevertheless, from viewpoints of long-term reliability, there is no avoiding wear and deterioration and a current imbalance or heat resistance changes in solders or wire bonded parts (not depicted) occur. For these reasons, the semiconductor chips in each semiconductor module differ in heat history, with the result that a junction temperature of, for example, one semiconductor chip 16b could be an abnormal temperature.

Reference is made back to FIG. 1. The controller 7 includes a gate drive section 32 that applies a drive voltage to the gate terminal 12 of the semiconductor chips 16 in each semiconductor module 3 and a control command signal generation section 31 that controls the gate drive section 32.

Furthermore, connected thereto is a temperature detection section 20 that detects an overall average junction temperature Tj1 of the semiconductor chips in each semiconductor module 3 and a local temperature Tj2 of one chip therein from current values acquired by the main current sensors 4a to 4f on the basis of a trigger signal from the control command signal generation section 31.

Tj1 and Tj2 of each of the semiconductor modules 3a to 3f calculated by the temperature detection section 20 are sent to a parameter computing section 30. The parameter computing section 30 determines whether a temperature abnormality occurs by predetermined computation and sends temperature abnormality information to the GUI 9.

Moreover, a current detector 10 detects phase current values of the electric motor by signals from the current sensors 8a and 8b. The phase current values are sent from the current detector 10 to the parameter computing section 30. The parameter computing section 30 sends a signal to the control command signal generation section 31 on the basis of the temperature information to instruct the control command signal generation section 31 to issue a relaxation operation command. The gate drive section 32 performs relaxation driving in response to the command from the control command signal generation section 31 and exercises feedback control on the basis of signals from the current detector 10. The gate drive section 32 sends a relaxation driving result to the GUI 9. Alternatively, a user can issue an instruction of the relaxation driving via the GUI 9. On the basis of results of Tj1 and Tj2 after the relaxation driving, an instruction of maintenance of a cooling system or replacement of the semiconductor module is displayed on the GUI 9.

<2. Temperature Detection Section>

Figure 4:
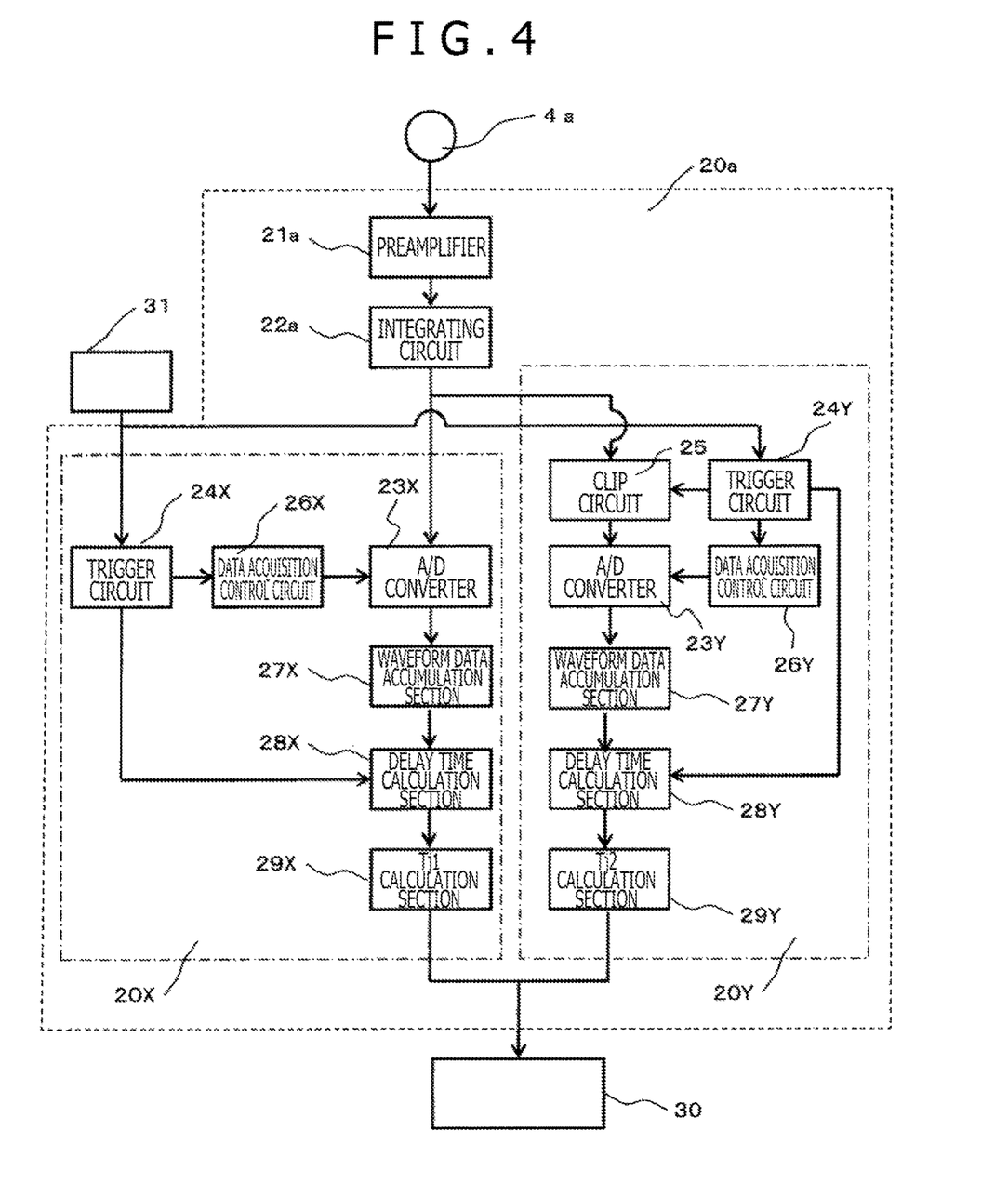
FIG. 4 is a block diagram illustrating an embodiment of a temperature detection section according to the present invention.

An example of an embodiment of the temperature detection section 20 according to the present invention will be explained with reference to FIG. 4. A temperature detection sub-section 20a of FIG. 4 is a circuit configuration as a section that receives a signal from the main current sensor 4a. Temperature detection sub-sections corresponding to the main current sensors 4b to 4f may be configured similarly. The temperature detection section 20 in the embodiment of FIG. 1 includes six sets having the configuration depicted in FIG. 4, and each of the sub-section monitors temperatures of the corresponding semiconductor module 3.

In the temperature detection sub-section 20a, a preamplifier 21a amplifies a signal from the main current sensor 4a to a line level. The amplified signal is converted into an analog voltage signal corresponding to the current value through an integrating circuit 22a. While the main current sensor 4a detects an amount of change in a current by a coil or the like and the integrating circuit 22a performs integration, thereby obtaining the current value in this example, the current value may be obtained by another method.

In the embodiment of FIG. 4, the temperature detection sub-section 20a includes a block 20X that detects an overall temperature of the semiconductor module 3 and a block 20Y that detects a local temperature of the semiconductor module 3, and the obtained current value is branched off and input to the blocks.

In the block 20X that detects the overall temperature of the semiconductor module, a trigger circuit 24X decides reference time for delay time on the basis of the signal from the control command signal generation section 31. A data acquisition control circuit 26X decides a current acquisition range during turn-off by deciding a predetermined period with the reference time as a start. An output from the integrating circuit 22a is acquired over the current acquisition range and an acquired current waveform is digitized by an A/D converter 23X.

The digitized data is accumulated in a waveform data accumulation section 27X, and a delay time calculation section 28X calculates delay time t1 from the control command signal based on a first main current set value (for example, 30 A). At this time, the delay time calculation section 28X obtains the reference time for the delay time from the trigger circuit 24X. A Tj1 calculation section 29X calculates a temperature on the basis of a difference with delay time at a room temperature calculated in advance. A Tj1 calculation method will be explained later in <3. Temperature Calculation Method>.

The block 20Y that detects the temperature of one semiconductor chip 16 has similar configurations to those of the block 20X. The same reference characters are used to denote the similar configurations while different indexes are added to the reference characters. Differences from the configurations of the block 20X will be explained. If a maximum value of the main current is 1000 A and an A/D converter at a wave height resolution of 8 bits is used, a quantization error is approximately 4 A. Owing to this, this A/D converter is not suited for measurement of a tail part (low current side) of the main current. For this reason, it is desirable in the block 20Y of the present embodiment to branch off a main current signal by means of a configuration that uses a clip circuit 25. A trigger circuit 24Y activates the clip circuit 25 at a second main current setting value (for example, 20 A) of a main current waveform on the basis of the signal from the control command signal generation section 31 to extract an analog signal.

The extracted analog signal is digitized by an A/D converter 23Y on the basis of a command from a data acquisition control circuit 26Y and accumulated in a waveform data accumulation section 27Y, and a delay time calculation section 28Y calculates delay time t2 from the second main current set value on the basis of reference time for the delay time obtained from the trigger circuit 24Y. A Tj2 calculation section 29Y calculates a temperature on the basis of a difference with delay time at the room temperature calculated in advance. A Tj2 calculation method will be explained later in <3. Temperature Calculation Method>.

Sampling rates of the A/D converters 23X and 23Y are desirably equal to or higher than 1 Gbps. In addition, unless the sampling rates fall, wave height resolutions of the A/D converters 23X and 23Y are desirably equal to or higher than 8 bits. Results of Tj1 and Tj2 are sent to the parameter computing section 30.

In the embodiment of FIG. 4, the temperature detection sub-section 20a is configured with the two blocks, i.e., the blocks 20X and 20Y on the premise of using the 8-bit A/D converters. If an A/D converter at a wave height resolution of 12 bits or higher is used as the A/D converter 23X, then the block 20Y may not be used and the temperature detection sub-section 20a may be configured only with the block 20X, and Tj2 calculation can be performed by the Tj1 calculation section 29X.

<3. Temperature Calculation Method>

An embodiment of a method of calculating the average junction temperature Tj1 and the local junction temperature Tj2 in the semiconductor module according to the present invention will be explained with reference to FIGS. 5A and 5B to 8. The following results were obtained by studies conducted by the inventors.

Figure 5A:
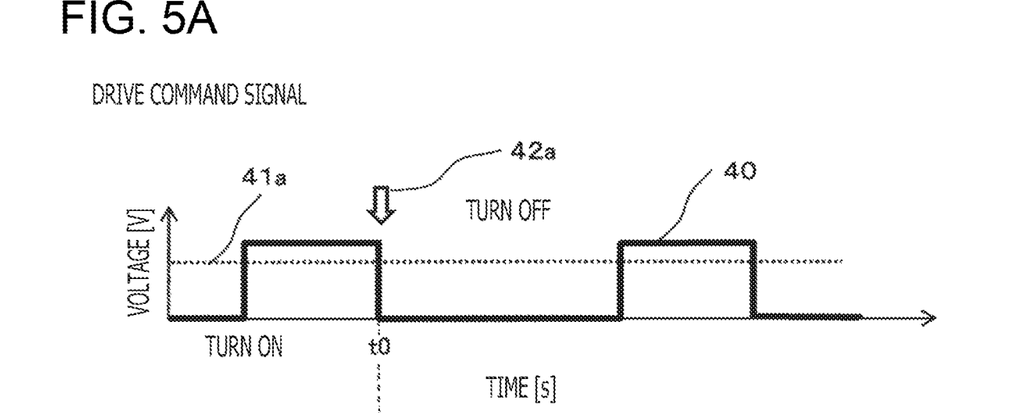
FIGS. 5A and 5B are waveform views illustrating a main current waveform acquisition method according to the present invention.

FIG. 5A illustrates a drive command signal (rectangular wave) 40 output from the control command signal generation section 31, used to drive a gate (for example, 12) of the transistor, and used to issue a command to turn on (switch on) and turn off (switch off) the gate. The trigger circuit 24 decides a trigger threshold voltage 41a and defines a fall point 42a as reference time t0.

Figure 5B:
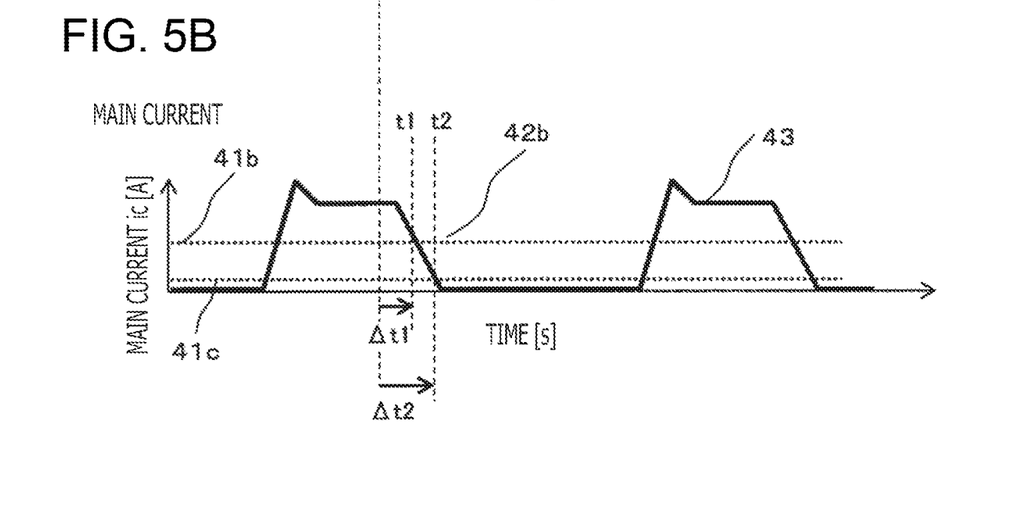

FIG. 5B illustrates a main current waveform 43 based on the drive command signal 40 of FIG. 5A. From the time t1 at which the main current takes a first main current set value 41b (suitably 50 A), delay time Δt1=t1−t0 is determined. Likewise, from the time t2 at which the main current takes a second main current set value 41c (suitably 3 A), delay time Δt2=t2−t0 is determined. As the main current falls more slowly, values of Δt1 and Δt2 become larger.

It is desirable to determine the values, i.e., the first main current set value 41b and the second main current set value 41c, depending on characteristics of the device to be measured in a strict sense. To this end, the values can be decided appropriately by, for example, measuring data as will be explained later with reference to FIGS. 6A to 6C, and 7. In a case of an ordinary power semiconductor switch device, the first main current set value 41b may be set to approximately 50 A and the second main current set value 41c may be set to approximately 3 A as described above. In this case, the first main current set value 41b is a value ten times or more as large as the second main current set value 41c.

Figure 6A:
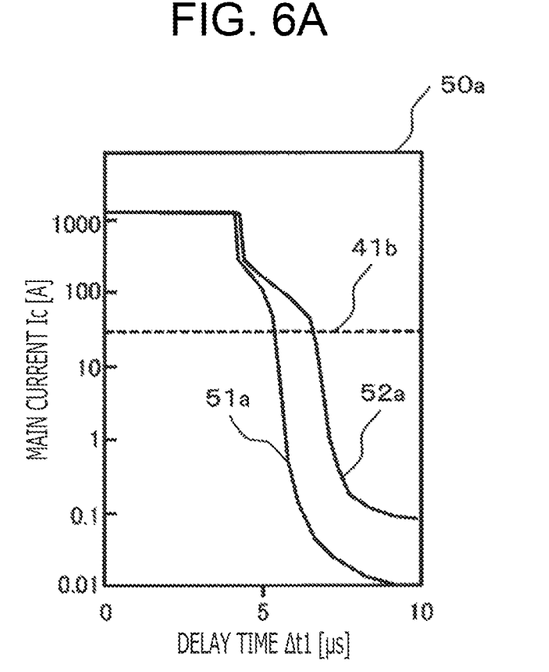
FIGS. 6A and 6B are graph charts illustrating examples of a main current waveform during turn-off.

FIG. 6A illustrates main current waveforms 50a in a case of turning off a main current of 1000 A, where the main current waveforms 50a include a waveform 51a at a semiconductor module overall temperature of 25° C. and a waveform 52a at the semiconductor module overall temperature of 125° C. It should be noted that a vertical axis is on a logarithmic scale. It can be understood that at the first main current set value 41b, the waveform 52a changes from the waveform 51a by as much as approximately 1 μs.

Figure 6B:
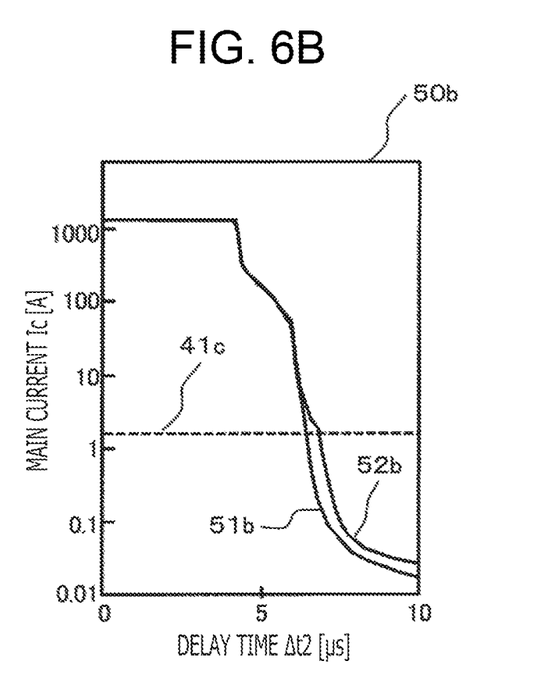

FIG. 6B illustrates waveforms 50b of a tail part of the main current during turn-off, where the waveforms 50b include a waveform 51b at the semiconductor module overall temperature of 75° C. and a waveform 52b at the semiconductor module overall temperature of 75° C. and at a one-chip local temperature of 150° C. It can be understood that at the second main current set value 41c, the waveform 52b changes from the waveform 52a by as much as approximately 0.2 μs.

Figure 6C:
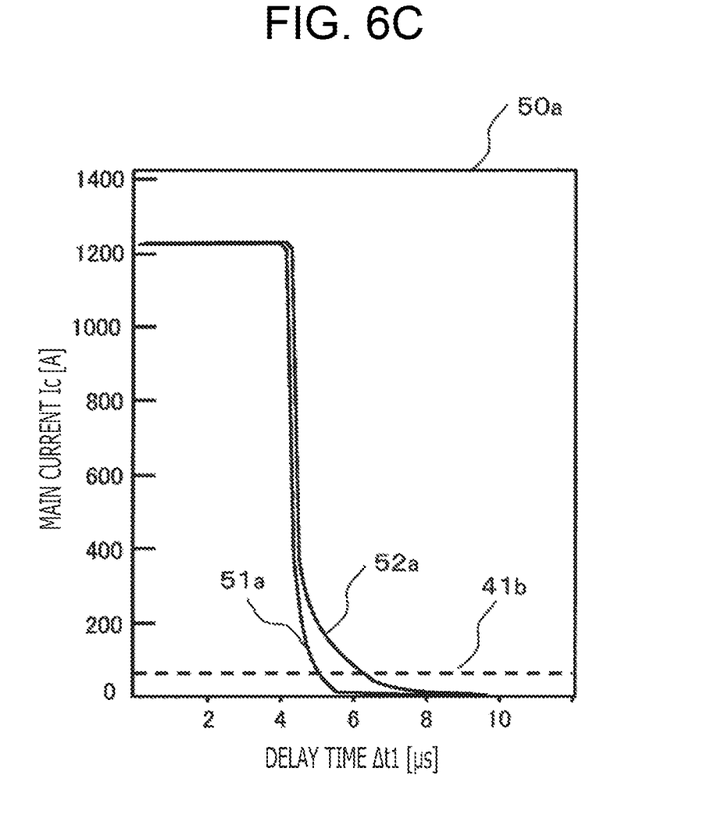
FIG. 6C is a graph chart illustrating examples of the main current waveform during turn-off.

FIG. 6C illustrates the main current waveforms 50a in a case of turning off a main current of 1200 A, where the main current waveforms 50a include the waveform. 51a at the semiconductor module overall temperature of 25° C. and the waveform 52a at the semiconductor module overall temperature of 125° C. While a vertical axis is on a linear scale, the change depicted in FIG. 6B is less visible in a case of depicting the main current waveforms on a linear scale. This is because an amount of change in a case of FIG. 6B in which the semiconductor module overall temperature is changed ten times or more as large as that in a case of FIG. 6A.

Figure 7A:
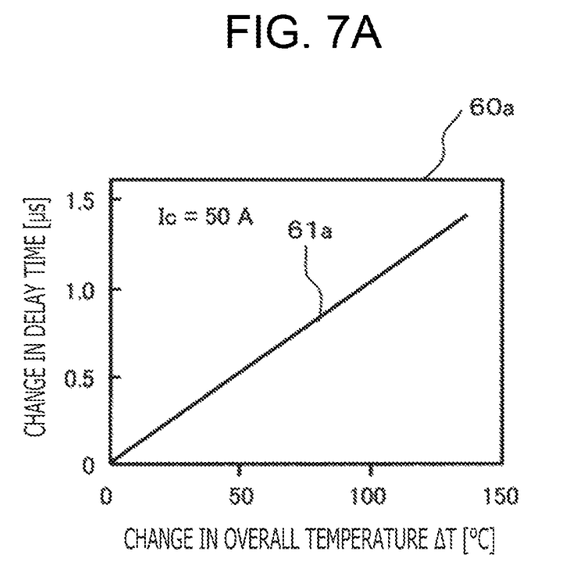
FIGS. 7A and 7B are graph charts illustrating examples of dependence of main current waveform delay time on change in temperatures during turn-off.

FIG. 7A illustrates dependence 60a of change in delay time on the semiconductor module overall temperature when the first main current set value is 50 A. The change in delay time is proportional to change in temperatures as indicated by 61a when the first main current set value is set appropriately. Since the first main current set value depends on semiconductor chip or transistor operating conditions, appropriate conditions are set as the operating conditions in advance.

Figure 7B:
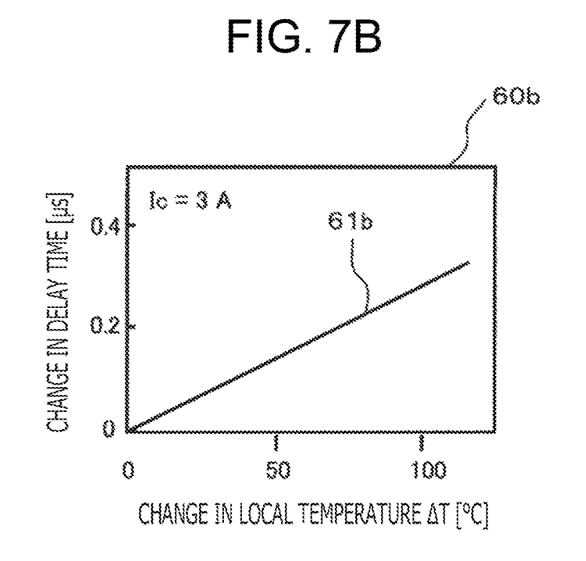

FIG. 7B illustrates dependence 60b of the change in delay time on change in a one-chip temperature where the second main current set value is 3 A and the semiconductor module overall temperature is 75° C. The change in delay time is proportional to the change in the temperature as indicated by 61b when the second main current set value is set appropriately. Since the second main current set value depends on semiconductor chip or transistor operating conditions, appropriate conditions are set as the operating conditions in advance.

An embodiment of calculating the overall temperature Tj1 and the one-chip local temperature Tj2 in the semiconductor module will be explained while referring to FIGS. 8A and 8B by way of example.

Figure 8A:
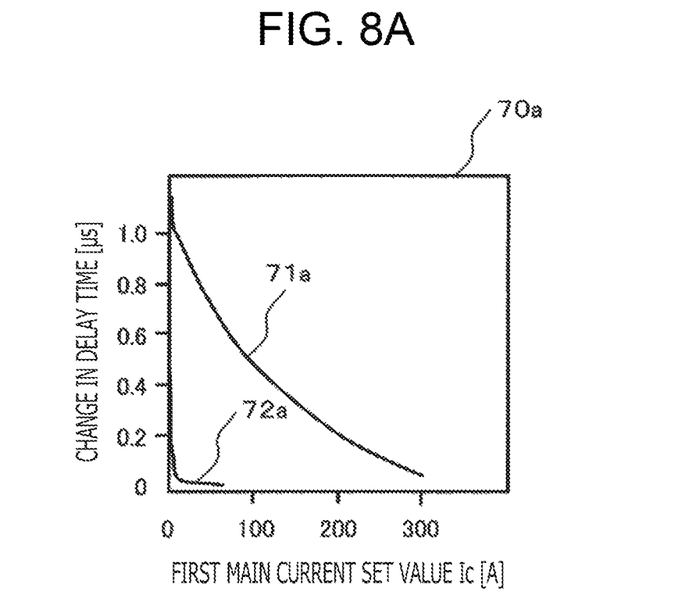
FIGS. 8A and 8B are graph charts illustrating examples of main current value dependence of main current delay time during turn-off.

In FIG. 8A, a curve 71a depicts dependence of an amount of change in the delay time on the first main current set value when the module overall temperature rises from 75° C. to 150° C., and a curve 72a depicts dependence of the amount of change in the delay time on the first main current set value when the module overall temperature rises from 75° C. and the one-chip local temperature rises from 75° C. to 150° C. It can be understood that the amount of change in the delay time with the first main current value has sensitivity for change in the overall temperature but has no sensitivity therewith for change in the one-chip local temperature.

Figure 8B:
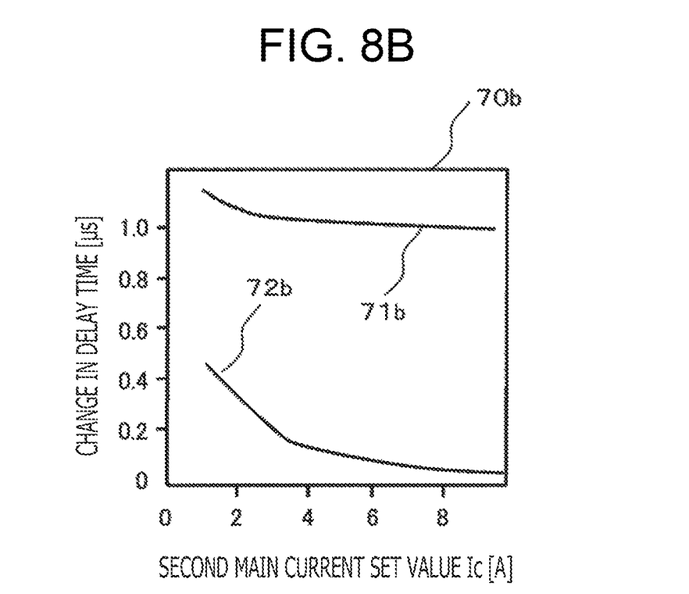

It can be understood that the amount of change in the delay time with the second main current set value has sensitivity for both the change in the overall temperature and the change in the one-chip local temperature of FIG. 8B. In this way, it can be understood that the temperature detection section 20 obtains the overall module junction temperature Tj1 and the local one-chip junction temperature Tj2 from the amounts of change in the delay time at the first main current set value and the second main current set value. It should be noted that a scale of a horizontal axis of FIG. 8A differs from that of FIG. 8B by two digits.

Second Embodiment

A second embodiment of a system that prevents fatal destruction by monitoring a state of the power conversion apparatus, supports maintenance, or extends an operating period by life-prolonging control will be explained while referring to the first embodiment.

Figure 9:
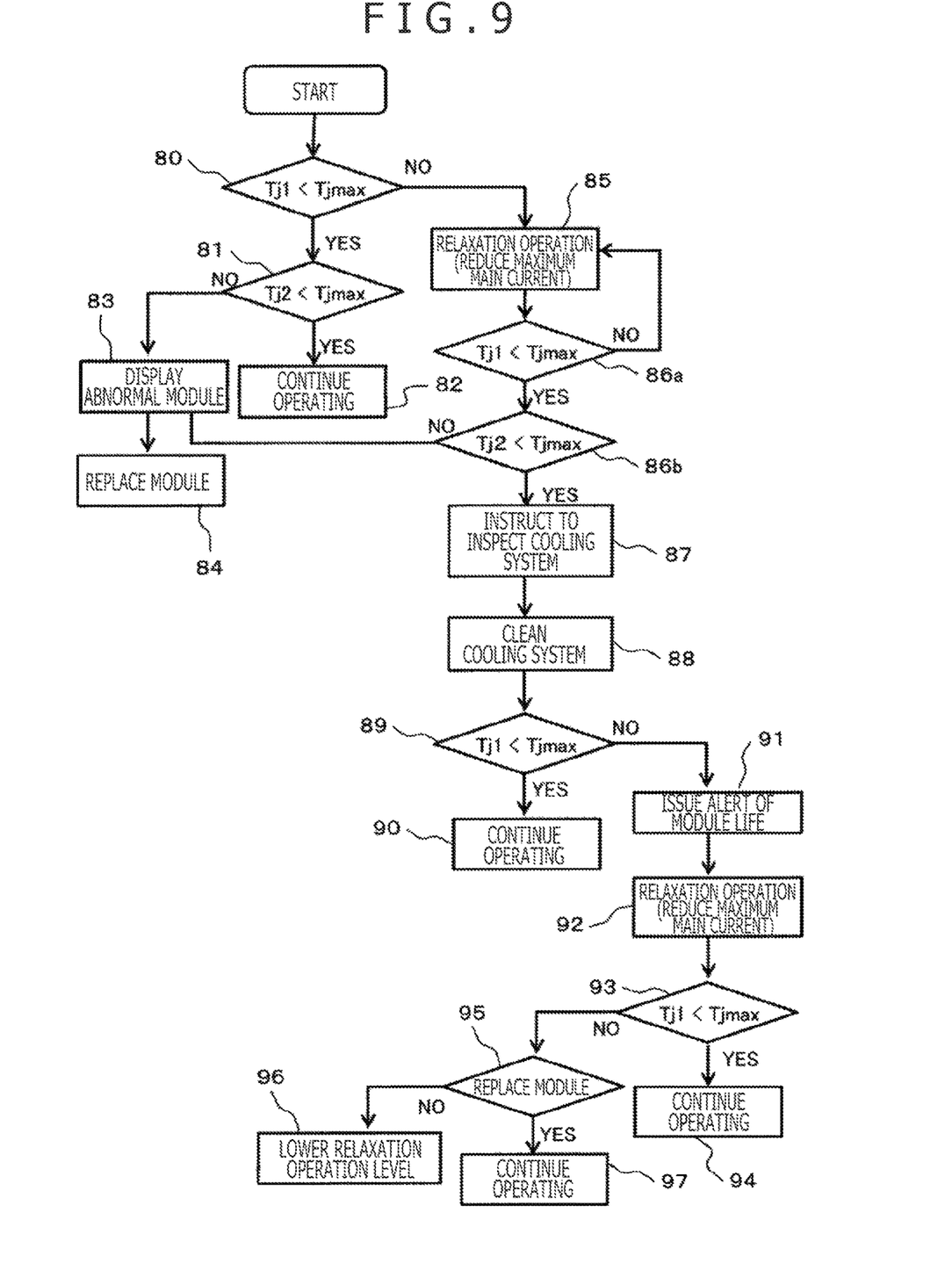
FIG. 9 is a flowchart illustrating a flow of life prolongation control, a diagnosis, and a maintenance instruction with respect to a power conversion apparatus according to the present invention.

A process flow of the second embodiment will be explained with reference to FIG. 9. When the module overall junction temperature Tj1 and the local one-chip junction temperature Tj2 are below a maximum junction temperature Tjmax set by the user, the temperatures are determined to be permissible and the module is, therefore, caused to continue operating (80 to 82). While the maximum junction temperature Tjmax can be set as appropriate in accordance with apparatus specifications, the maximum junction temperature Tjmax is set to approximately 150° C., preferably equal to or lower than 150° C. in a case of, for example, a silicon device.

On the other hand, when only Tj2 exceeds Tjmax, it can be determined that a specific semiconductor chip 16 is overheated. In this case, the specific semiconductor chip 16 is assumed to be abnormal; thus, the operation of the semiconductor module 16 is stopped and the semiconductor module 3 including the specific semiconductor chip 16 is replaced (80 to 81, 83 to 84).

It may be possible to replace only the abnormal semiconductor chip on site; however, it is efficient to replace the semiconductor module 3 entirely since the semiconductor module normally has an integrated configuration.

Furthermore, when Tj1 is determined as Tj1>Tjmax, it is assumed that the overall temperature of the semiconductor module 3 rises; in this case, therefore, the semiconductor module 3 is caused to perform a relaxation operation (80 to 85).

After the relaxation operation, when Tj1 is determined as Tj1<Tjmax (86a) and Tj2 is determined as Tj2>Tjmax (86b), it can be determined that the specific semiconductor chip 16 is overheated as is expected; thus, the semiconductor module 3 is replaced.

On the other hand, when Tj2 is determined as Tj2<Tjmax (86b), it is considered that a cause by which the overall semiconductor module 3 is overheated is, for example, an abnormality in a cooling system. In this case, an instruction to, for example, inspect the cooling system is issued (87). The instruction is displayed, for example, on the graphical user interface (GUI) 9 of FIG. 1. In response to the instruction, maintenance personnel conducts cleaning of a fan or fin of the cooling system, fan operation confirmation, or the like.

Subsequently, when Tj1 is determined as Tj1<Tjmax (89) while the semiconductor module 3 operates normally, the semiconductor module 3 is caused to continue operating (90). When Tj is determined as Tj>Tjmax (89), the maintenance personnel is alerted to the fact that the overall module wears and deteriorates and the module is close to the end of life (91) and the semiconductor module 3 is caused to perform the relaxation operation (92). Subsequently, when Tj is determined as Tj<Tjmax (93), the semiconductor module 3 is caused to continue the relaxation operation (94).

When Tj is determined as Tj>Tjmax (93), the semiconductor module 3 is replaced by a backup module (95, 97) or is caused to continue operating with a relaxation level set lower (96).

While the temperature Tjmax is commonly used as the threshold for Tj1 and that for Tj2 in the above example, different thresholds may be used.

Indications of 83, 85, 87, 91, 92, 95, and the like are displayed to the user on the GUI 9. In a management mode, log information can be also displayed. A user interface section is configured integrally with the temperature detection section or separably connected to the temperature detection section by wired connection, wireless connection, or terminal connection. In the case of making separable connection, a high degree of freedom in configuration is attained; thus, the power conversion apparatus mounted in, for example, an electric train can undergo a diagnosis by a monitoring system at a remote location. Furthermore, necessary information can be displayed on a portable terminal carried by the maintenance personnel over wireless communication.

The present invention is not limited to the embodiments described above but encompasses various modifications. For example, the configuration of a certain embodiment can be partially replaced by the configuration of the other embodiment or the configuration of the other embodiment can be added to the configuration of the certain embodiment. Moreover, for a part of the configuration of each embodiment, additions, omissions, and substitutions of the other configurations can be made.

According to the present embodiments explained so far in detail, it is possible to provide a power conversion apparatus that can highly precisely detect an abnormality or a deterioration in a power semiconductor and the power conversion apparatus associated with the power semiconductor, highly precisely prevent a malfunction such as a failure, and ensure long-term use by detecting a rate of change in a current of the power semiconductor and comparing the rate of change with a reference value to determine whether the abnormality or deterioration occurs to the power semiconductor.

INDUSTRIAL APPLICABILITY

The present invention is applicable in the field of maintenance and inspection for various types of power semiconductors and the like.

DESCRIPTION OF REFERENCE CHARACTERS

1: Power conversion apparatus
2: Electric motor
3, 3a, 3b, 3c, 3d, 3e, 3f: Power semiconductor module
4a, 4b, 4c, 4d, 4e, 4f: Main current sensor
5: Smoothing capacitor
6: Direct-current voltage source
7: Controller
8a, 8b: Phase current sensor
9: GUI
10: Current detector
11: Collector terminal
12: Gate terminal
13: Emitter terminal
14: Diode
15: Transistor
16a, 16b, 16c, 16d, 16e, 16f: Semiconductor chip
20, 20a, 20b: Temperature detection section
21: Preamplifier
22: Integrating circuit
23X, 23Y: A/D converter
24X, 24Y: Trigger circuit
25: Clip circuit
26X, 26Y: Data acquisition control circuit
27X, 27Y: Waveform data accumulation section
28X, 28Y: Delay time calculation section
29X: Tj1 Calculation section
29Y: Tj2 Calculation section
30: Parameter computing section
31: Control command signal generation section
32: Gate drive section
50a, 50b: Main current waveform during turn-off
51a, 51b: Main current waveform during turn-off
52a, 52b: Main current waveform during turn-off
60a, 60b: Temperature dependence of main current waveform delay amount during turn-off
60a, 60b: Temperature dependence of main current waveform delay amount during turn-off
61b: Temperature dependence of delay time at second threshold current
70a, 70b: Main current set value dependence of change in main current waveform delay amount during turn-off
71a, 71b: Change in overall temperature in modules
72a, 72b: Change in local temperature in module

The invention claimed is:

1. A diagnostic system for a power conversion apparatus that includes a semiconductor device and that performs a switching operation for carrying and interrupting a main current to a main circuit, the diagnostic system comprising:
 a trigger circuit that acquires reference time for the switching operation; and
 a delay time calculation circuit that acquires first time at which the main current takes a first main current set value and second time at which the main current takes a second main current set value, and that detects numerical data about a difference between the first time and the reference time and numerical data about a difference between the second time and the reference time;

wherein junction temperatures of the semiconductor device are calculated from the numerical data about the difference between the first time and the reference time and the numerical data about the difference between the second time and the reference time;

wherein the junction temperatures include an average junction temperature Tj1 of a plurality of semiconductor chips included in the semiconductor device and a local junction temperature Tj2 of only part of the plurality of semiconductor chips; and wherein the power conversion apparatus is controlled from a magnitude relationship between the junction temperatures Tj1 and Tj2 with preset Tjmax assumed as a reference value.

2. The diagnostic system for the power conversion apparatus according to claim 1, wherein an alert to an abnormality in the semiconductor device is issued from the magnitude relationship between the junction temperatures Tj1 and Tj2 with the preset Tjmax assumed as the reference value.

3. The diagnostic system for the power conversion apparatus according to claim 1, wherein an alert to an abnormality in a cooling system of the power conversion apparatus is issued from the magnitude relationship between the junction temperatures Tj1 and Tj2 with the preset Tjmax assumed as the reference value.

4. A diagnostic method for a semiconductor module that mounts a plurality of switching devices and that performs a switching operation for carrying and interrupting a main current on the basis of a drive command signal, the diagnostic method comprising:

a reference time setting step of setting reference time for the switching operation during interruption of the main current;

a first delay time measuring step of measuring as first delay time a delay of first time at which the main current takes a first main current set value from the reference time during the interruption of the main current; and a second delay time measuring step of measuring as second delay time a delay of second time at which the main current takes a second main current set value from the reference time during the interruption of the main current, wherein the first main current set value is set larger than the second main current set value, a first temperature is determined on the basis of the first delay time, and the first temperature is compared with a first threshold, a second temperature is determined on the basis of the second delay time, and the second temperature is compared with a second threshold, first control is exercised if the first temperature exceeds the first threshold, and second control is exercised if the first temperature does not exceed the first threshold and the second temperature exceeds the second threshold.

5. The diagnostic method for the semiconductor module according to claim 4, wherein an overall temperature of the semiconductor module is determined on the basis of the first delay time, and a temperature of part of the semiconductor module is determined on the basis of the second delay time.

6. The diagnostic method for the semiconductor module according to claim 4, wherein the first control is a relaxation operation of the semiconductor module, and the second control is an alert to making notification of an abnormality in the semiconductor module.

7. The diagnostic method for the semiconductor module according to claim 6, wherein if the first temperature does not exceed the first threshold and the second temperature does not exceed the second threshold as a result of the relaxation operation, an alert to instruct maintenance of the semiconductor module is issued.

8. The diagnostic method for the semiconductor module according to claim 4, wherein measurement precision of the second delay time is set higher than measurement precision of the first delay time.

9. The diagnostic method for the semiconductor module according to claim 8, wherein the first delay time measuring step includes measuring the first delay time on the basis of a digital signal using a first analog-to-digital converter that converts an analog signal indicating the main current into the digital signal, the second delay time measuring step includes measuring the second delay time on the basis of a digital signal using a second analog-to-digital converter that converts the analog signal indicating the main current into the digital signal, and in order to make the measurement precision of the second delay time higher than the measurement precision of the first delay time, a clip circuit is inserted in front of the second analog-to-digital converter.

10. The diagnostic method for the semiconductor module according to claim 4, wherein the first delay time measuring step includes measuring the first delay time on the basis of a digital signal using a first analog-to-digital converter that converts an analog signal indicating the main current into the digital signal, the second delay time measuring step includes measuring the second delay time on the basis of the digital signal using the first analog-to-digital converter, and an analog-to-digital converter at a wave height resolution of 12 bits or higher is used as the first analog-to-digital converter.

11. A power conversion apparatus to which a direct current is input and which outputs an alternating current to a load, comprising:

a plurality of semiconductor modules;

a control command signal generation section that instructs the plurality of semiconductor modules to perform a switching operation; and a plurality of controllers each of which corresponds to one of the plurality of semiconductor modules, wherein each of the plurality of semiconductor modules includes a plurality of semiconductor switching devices connected in parallel, the control command signal generation section generates a control command signal to instruct the plurality of semiconductor switching devices to interrupt a main current, the controllers each includes a temperature detection section that determines two types of temperatures for the corresponding semiconductor module, the temperature detection section includes:

a trigger circuit that sets reference time from the control command signal;

a first delay time measuring section that measures as first delay time a delay of first time at which the main current takes a first main current set value from the reference time during interruption of the main current; and a second delay time measuring section that measures as second delay time a delay of second time at which the main current takes a second main current set value from the reference time during the interruption of the main current, and a first temperature is determined from the first delay time and the first temperature is compared with a first threshold, and a second temperature is determined from the second delay time and the second temperature is compared with a second threshold, first control is exercised if the first temperature exceeds the first threshold, and second control is exercised if the first temperature does not exceed the first threshold and the second temperature exceeds the second threshold.

* * * * *